(12) United States Patent
Yu et al.

(10) Patent No.: US 10,756,040 B2
(45) Date of Patent: Aug. 25, 2020

(54) SEMICONDUCTOR PACKAGE WITH RIGID UNDER BUMP METALLURGY (UBM) STACK

(71) Applicant: MEDIATEK INC., Hsin-Chu (TW)

(72) Inventors: Ta-Jen Yu, Taichung (TW); Chi-Yuan Chen, New Taipei (TW); Wen-Sung Hsu, Zhubei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/881,063

(22) Filed: Jan. 26, 2018

(65) Prior Publication Data

US 2018/0233474 A1 Aug. 16, 2018

Related U.S. Application Data

(60) Provisional application No. 62/458,047, filed on Feb. 13, 2017.

(51) Int. Cl.
*H01L 23/485* (2006.01)
*H01L 23/488* (2006.01)
(Continued)

(52) U.S. Cl.
CPC ............ *H01L 24/13* (2013.01); *H01L 24/05* (2013.01); *H01L 24/06* (2013.01); *H01L 24/14* (2013.01);
(Continued)

(58) Field of Classification Search
CPC ......... H01L 24/11; H01L 24/13; H01L 24/06; H01L 24/05; H01L 24/14; H01L 23/3192; H01L 2224/11462; H01L 2224/05582; H01L 2224/03462; H01L 2224/06051; H01L 2224/14051; H01L 2224/13582; H01L 2224/13655; H01L 2224/05666; H01L 2224/05555; H01L 2224/05554; H01L 2224/05552; H01L 2224/05166; H01L 2224/05147; H01L 2224/05124; H01L 2224/0508; H01L 2224/13012; H01L 2224/0401; H01L 2224/05572; H01L 2224/13155; H01L 2224/13147;
(Continued)

(56) References Cited

U.S. PATENT DOCUMENTS 7,687,320 B2 * 3/2010 Nagasaki ............ H01L 23/3114
257/788
8,258,055 B2 * 9/2012 Hwang .................. H01L 24/03
438/613
(Continued)

FOREIGN PATENT DOCUMENTS

WO 2010/049087 A2 5/2010

*Primary Examiner* — Natalia A Gondarenko
(74) *Attorney, Agent, or Firm* — Wolf, Greenfield & Sacks, P.C.

(57) ABSTRACT

The invention provides a semiconductor package. The semiconductor package includes a semiconductor die and a conductive pillar bump structure and a conductive plug. The semiconductor die has a die pad thereon. The conductive pillar bump structure is positioned overlying the die pad. The conductive pillar bump structure includes an under bump metallurgy (UBM) stack having a first diameter and a conductive plug on the UBM stack. The conductive plug has a second diameter that is different than the first diameter.

19 Claims, 8 Drawing Sheets

(51) Int. Cl.
*H01L 23/525* (2006.01)
*H01L 29/40* (2006.01)
*H01L 23/48* (2006.01)
*H01L 23/498* (2006.01)
*H01L 23/02* (2006.01)
*H01L 23/04* (2006.01)
*H01L 23/12* (2006.01)
*H01L 23/00* (2006.01)
H01L 23/31 (2006.01)

(52) U.S. Cl.
CPC .......... *H01L 23/3192* (2013.01); *H01L 24/11* (2013.01); *H01L 2224/03462* (2013.01); *H01L 2224/0401* (2013.01); *H01L 2224/0508* (2013.01); *H01L 2224/05022* (2013.01); *H01L 2224/05027* (2013.01); *H01L 2224/0558* (2013.01); *H01L 2224/05124* (2013.01); *H01L 2224/05147* (2013.01); *H01L 2224/05166* (2013.01); *H01L 2224/05552* (2013.01); *H01L 2224/05554* (2013.01); *H01L 2224/05555* (2013.01); *H01L 2224/05559* (2013.01); *H01L 2224/05572* (2013.01); *H01L 2224/05582* (2013.01); *H01L 2224/05647* (2013.01); *H01L 2224/05666* (2013.01); *H01L 2224/06051* (2013.01); *H01L 2224/11462* (2013.01); *H01L 2224/131* (2013.01); *H01L 2224/13007* (2013.01); *H01L 2224/13012* (2013.01); *H01L 2224/13013* (2013.01); *H01L 2224/13014* (2013.01); *H01L 2224/13027* (2013.01); *H01L 2224/13083* (2013.01); *H01L 2224/13147* (2013.01); *H01L 2224/13155* (2013.01); *H01L 2224/13582* (2013.01); *H01L 2224/13655* (2013.01); *H01L 2224/14051* (2013.01); *H01L 2224/14104* (2013.01)

(58) Field of Classification Search
CPC ............ H01L 2224/29075–2224/29084; H01L 2224/0558; H01L 2224/14104; H01L 2224/05027; H01L 2224/131; H01L 2224/13083; H01L 2224/13027; H01L 2224/13014; H01L 2224/13013; H01L 2224/13007; H01L 2224/05647; H01L 2224/05559; H01L 2224/05022; H01L 2224/16–2224/16507; H01L 2224/32–2224/32507; H01L 2924/207–2924/2076; H01L 2224/732–2224/73281; H01L 2224/0215; H01L 2224/06–2224/06149; H01L 2224/07; H01L 2224/08–2224/0807; H01L 2224/081–2224/08121; H01L 2224/0903–2224/09055; H01L 2224/10–2224/10156; H01L 2224/15; H01L 2224/16188; H01L 2224/16257; H01L 2224/16268; H01L 2224/1483; H01L 2224/13084; H01L 2224/244; H01L 2224/29006; H01L 2224/29015; H01L 2224/29021–2224/29027
USPC .......... 257/737, 738, 786, E23.069, E23.068
See application file for complete search history.

(56) References Cited

U.S. PATENT DOCUMENTS

| | | | |
|---|---|---|---|
| 8,698,307 B2 | 4/2014 | Shih et al. | |
| 9,425,136 B2 | 8/2016 | Kuo et al. | |
| 2008/0083985 A1* | 4/2008 | Lee | H01L 24/05 257/737 |
| 2009/0174084 A1* | 7/2009 | Jadhav | H01L 24/12 257/786 |
| 2012/0248605 A1* | 10/2012 | Yamaguchi | H01L 24/03 257/738 |
| 2013/0075907 A1 | 3/2013 | Pang | |
| 2013/0127045 A1* | 5/2013 | Lin | H01L 23/293 257/737 |
| 2014/0264890 A1 | 9/2014 | Breuer et al. | |
| 2015/0318253 A1* | 11/2015 | Chang | H01L 25/50 257/737 |
| 2016/0148888 A1* | 5/2016 | Ryu | H01L 24/14 257/621 |
| 2018/0331054 A1* | 11/2018 | Kim | H01L 24/02 |

* cited by examiner

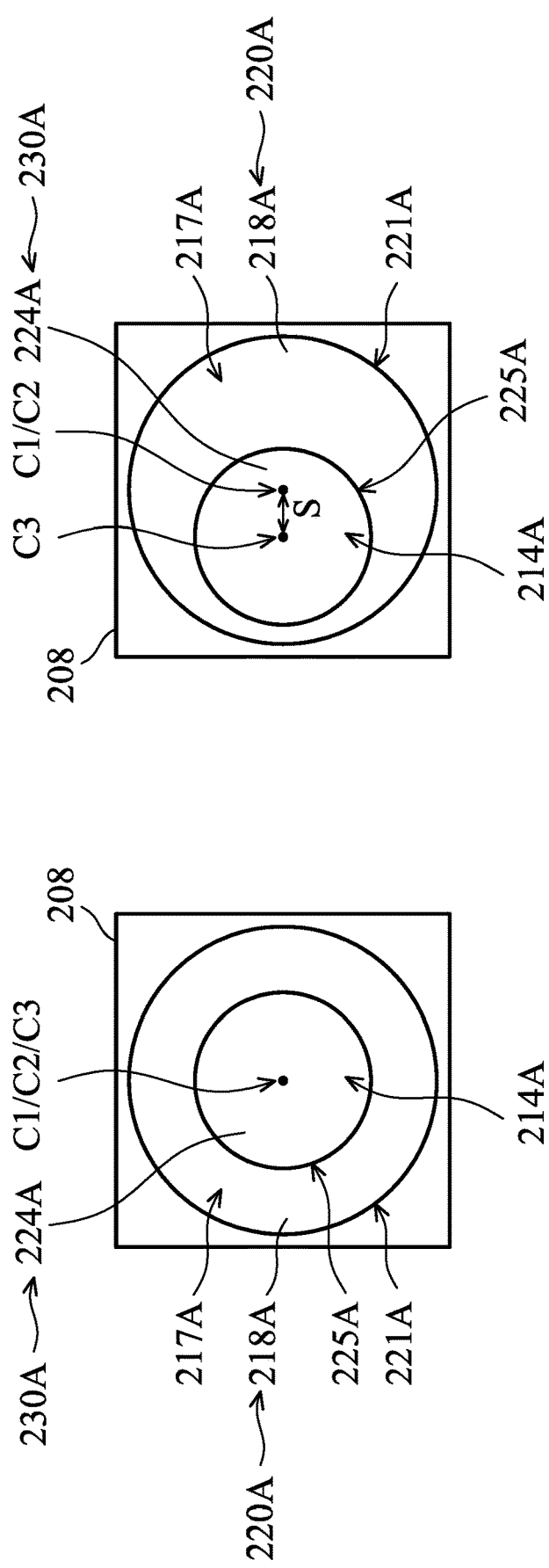

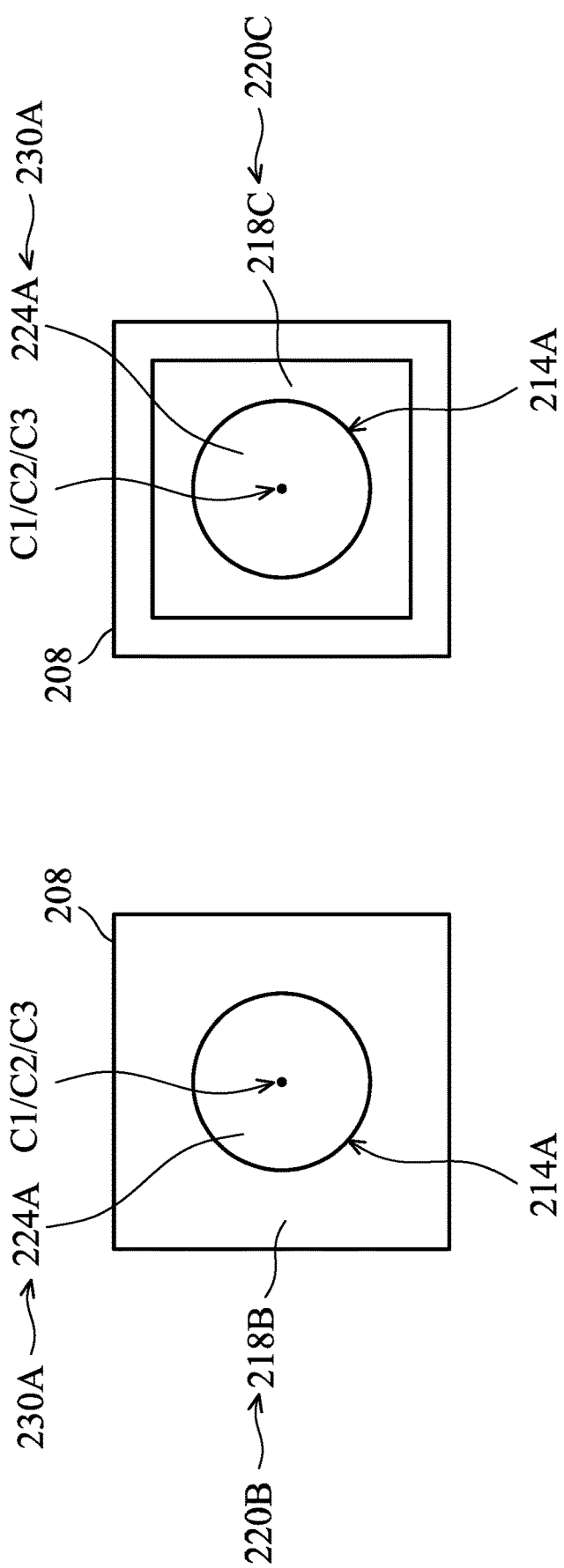

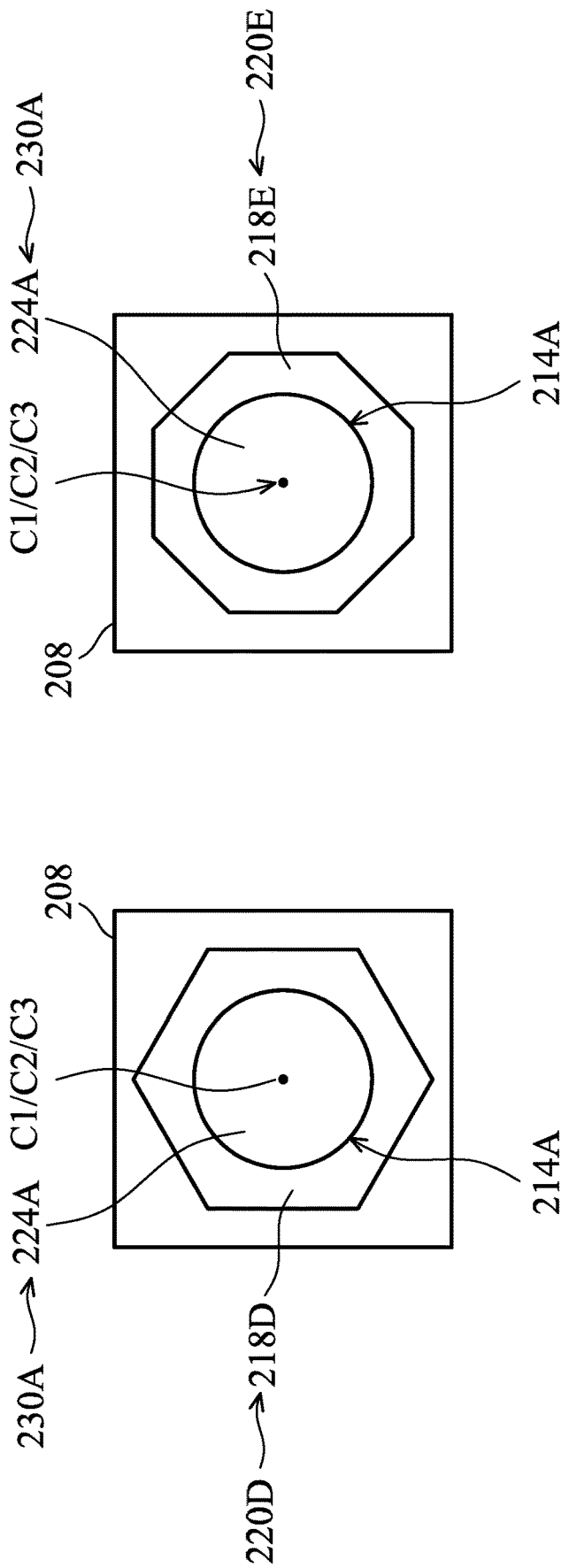

SEMICONDUCTOR PACKAGE WITH RIGID UNDER BUMP METALLURGY (UBM) STACK

CROSS REFERENCE TO RELATED APPLICATIONS

This application claims the benefit of U.S. Provisional Application No. 62/458,047 filed on Feb. 13, 2017, the entirety of which is incorporated by reference herein.

BACKGROUND OF THE INVENTION

Field of the Invention

The present invention relates to a semiconductor package, and in particular to a flip chip package with an improved extra-low-k (ELK) reliability.

Description of the Related Art

In order to ensure miniaturization and multi-functionality of electronic products and communication devices, semiconductor packages are required to be small in size and have multi-pin connection, high speed, and high functionality. Increased Input-Output (I/O) pin counts combined with the increased demand for high-performance ICs has led to the development of flip chip packages.

Flip-chip technology uses bumps on the chip to interconnect the package media such as a package substrate. The flip-chip is bonded face down to the package substrate through the shortest path. These technologies can be applied not only to single-chip packaging, but also to higher or integrated levels of packaging in which the packages are larger and to more sophisticated substrates that accommodate several chips to form larger functional units. The flip-chip technique, using an area array, has the advantage of achieving a higher density of interconnection to the device and a very low inductance interconnection to the package. The increased amount of input/output connections of a multi-functional flip-chip package requires the use of extra-low-k (ELK) dielectric layers. However, the ELK dielectric layers of the chip may be susceptible to cracking due to stress. The problem of cracks forming in the ELK dielectric layers may affect the reliability and quality of the finished product.

Thus, a novel semiconductor package is desirable.

BRIEF SUMMARY OF THE INVENTION

Exemplary embodiments of a semiconductor package are provided. An exemplary embodiment of a semiconductor package includes a semiconductor die and a conductive pillar bump structure and a conductive plug. The semiconductor die has a die pad thereon. The conductive pillar bump structure is positioned overlying the die pad. The conductive pillar bump structure includes an under bump metallurgy (UBM) stack having a first diameter and a conductive plug on the UBM stack. The conductive plug has a second diameter that is different than the first diameter.

Another exemplary embodiment of a semiconductor package includes a semiconductor die, a conductive pillar bump structure and a conductive plug. The semiconductor die has a die pad thereon. The conductive pillar bump structure is positioned overlying the die pad. The conductive pillar bump structure includes an under bump metallurgy (UBM) stack in contact with the die pad and a conductive plug in contact with the UBM stack. An overlapping area between the conductive plug and a top surface of the UBM stack is less than an area of the top surface of the UBM stack.

An exemplary embodiment of a semiconductor die, a conductive pillar bump structure and a conductive plug. The semiconductor die has a die pad thereon. The conductive pillar bump structure is positioned overlying the die pad. The conductive pillar bump structure includes a conductive plug and an under bump metallurgy (UBM) stack between the die pad and the conductive plug. A boundary of the UBM stack surrounds a boundary of the conductive plug from a plan view.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2A-2B are plan views showing arrangements of a second metal pad of an under bump metallurgy (UBM) stack and a conductive plug of a conductive pillar bump structure, and a die pad of a semiconductor die of a semiconductor package in accordance with some embodiments of the disclosure;

FIGS. 3A-3E are plan views showing shapes of second metal pads of under bump metallurgy (UBM) stacks and conductive plugs of conductive pillar bump structures in accordance with some embodiments of the disclosure.

DETAILED DESCRIPTION OF THE INVENTION

Figure 1:
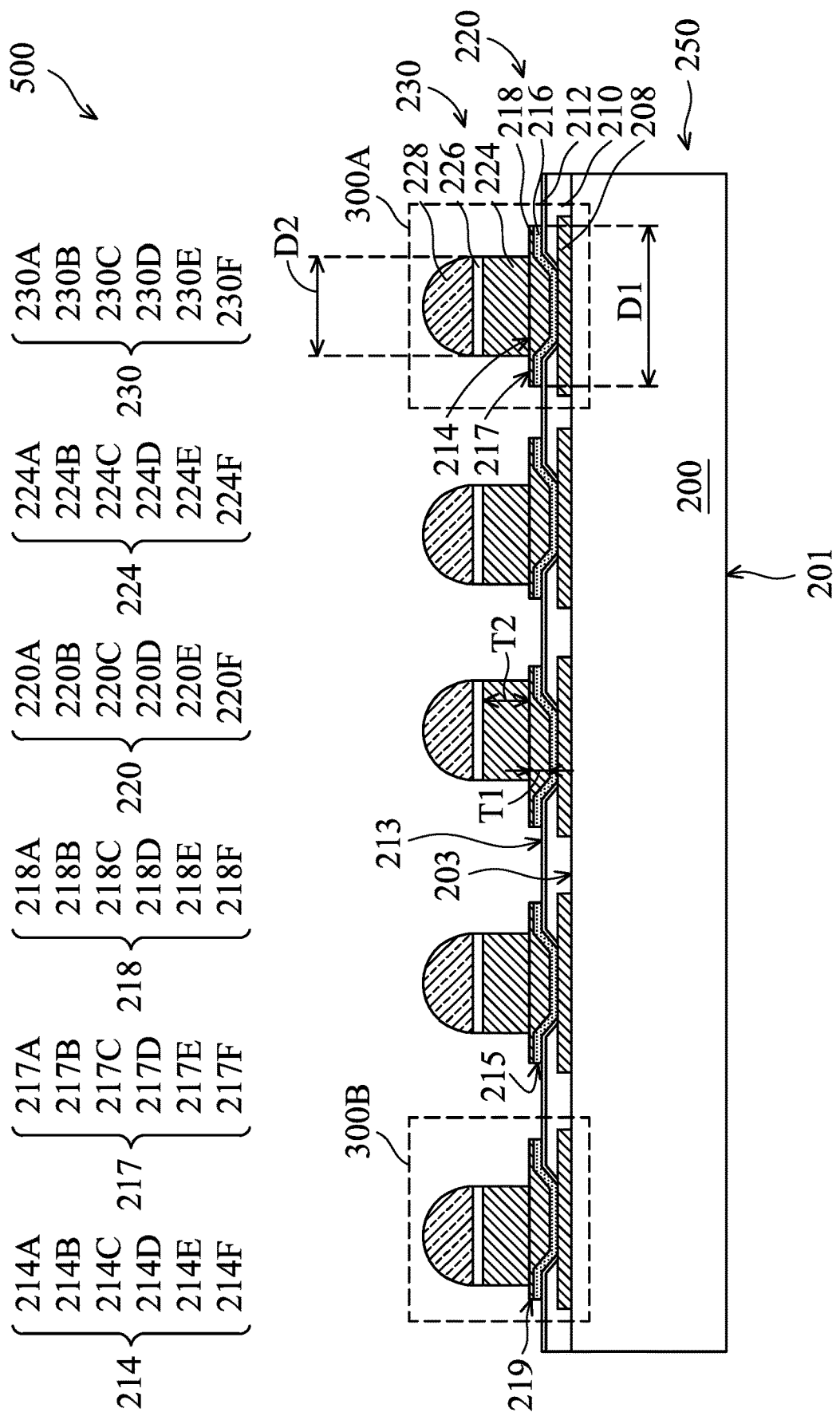
FIG. 1 is a cross-sectional view of a semiconductor package in accordance with some embodiments of the disclosure.
Figure 3E:
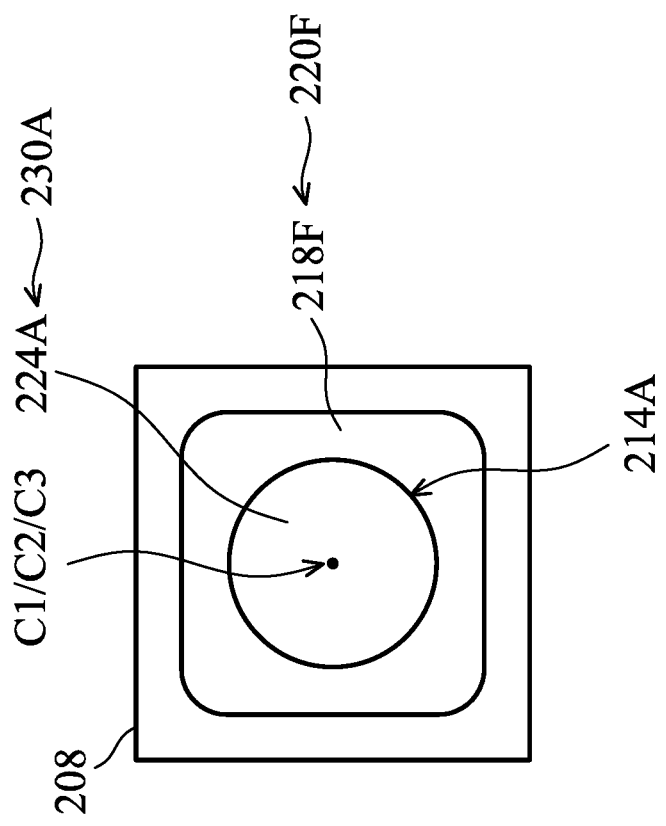
Figure 4B:
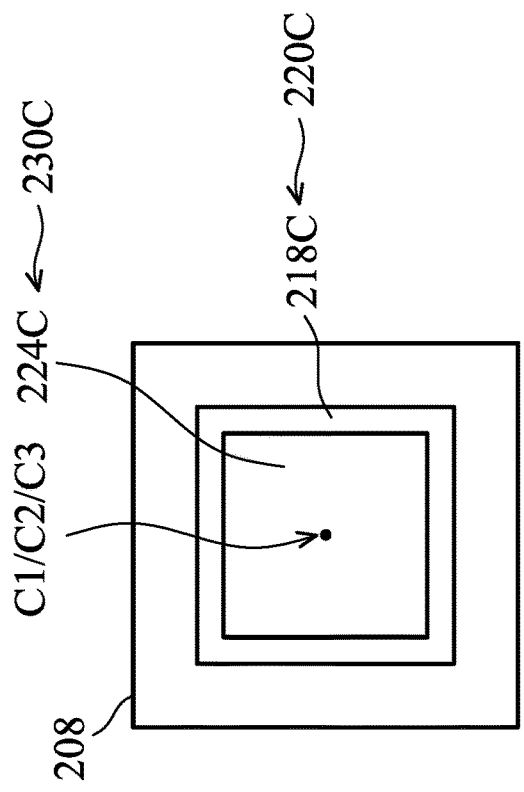
FIGS. 4A-4E are plan views showing shapes of second metal pads of under bump metallurgy (UBM) stacks and conductive plugs of conductive pillar bump structures in accordance with some embodiments of the disclosure.
Figure 4A:
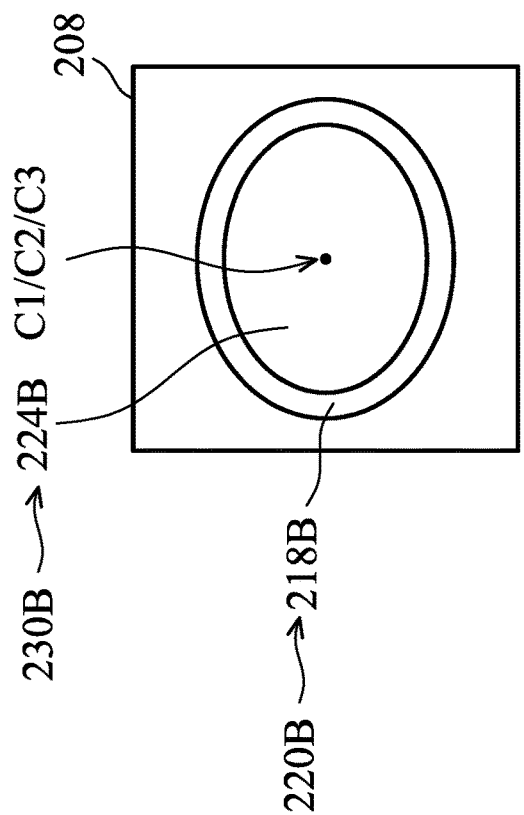
Figure 4D:
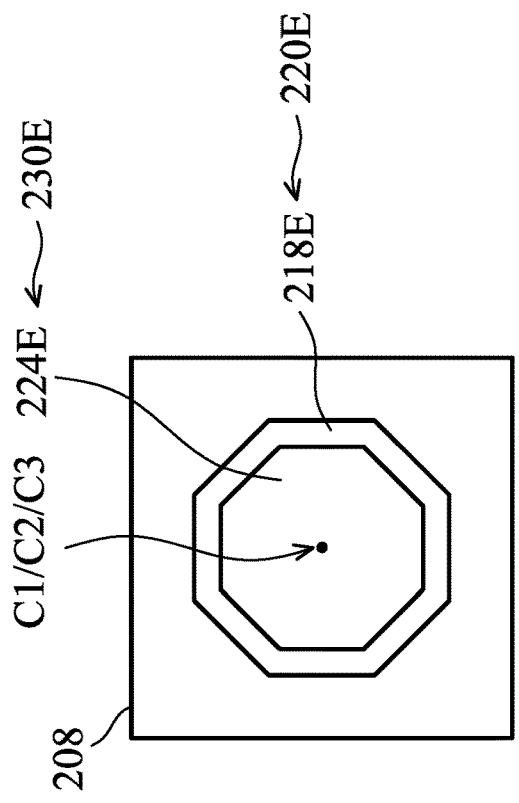
Figure 4C:
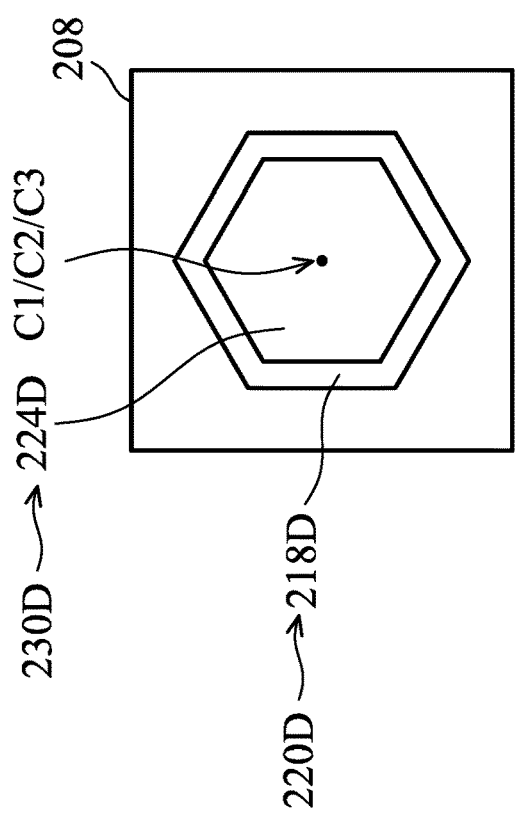
Figure 4E:
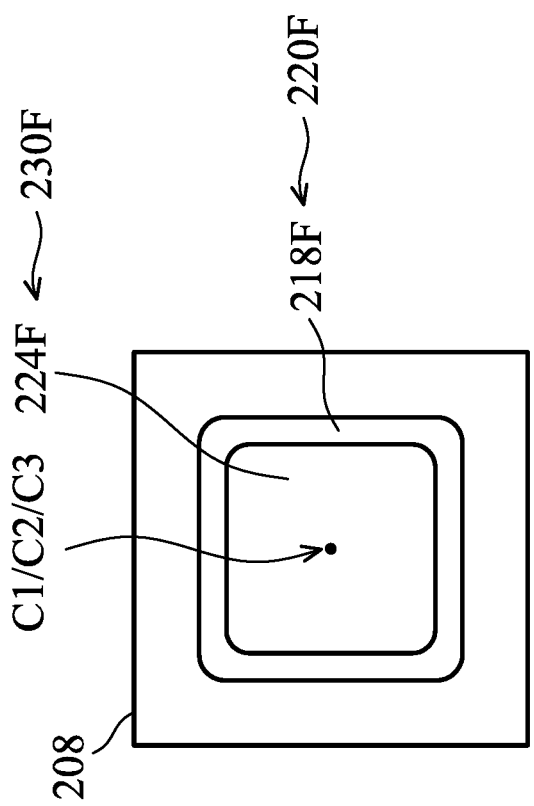

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package 500 in accordance with some embodiments of the disclosure. In some embodiments, the semiconductor package 500 is a flip-chip package using conductive pillar bumps, for example, copper pillar bumps, connecting a substrate (not shown). In some embodiments, the semiconductor package 500 includes a semiconductor die 250 and a conductive pillar bump structure 230 electrically coupled to the semiconductor die 250.

As shown in FIG. 1, the semiconductor die 250 is provided. The semiconductor die 250 may have a back-side surface 201 and a front-side surface 203 opposite to the back-side surface 201. In some embodiments, the semiconductor die 250 includes a base 200, a die pad 208 overlying the base 200, and a first passivation layer 210 covering the base 240 and a portion of the die pad 208. In some embodiments, the base 200 may include but is not limited to a semiconductor substrate, circuit elements fabricated on the main surface of the semiconductor substrate, inter-layer dielectric (ILD) layers and an interconnection structure. For example, the interconnection structure may include a plurality of metal layers, a plurality of dielectric layers alternatively laminated with the metal layers and a plurality of vias formed through the dielectric layers on the semiconductor substrate. For example, the dielectric layers of the interconnection structure may be extra-low-k (ELK) dielectric layers. The die pad 208 belongs to the topmost metal layer of the metal layers of the interconnection structure. The die pad 208 may include but is not limited to aluminum (Al), copper (Cu) or alloys thereof. In some embodiments, the first passivation layer 210 has an opening (not shown) to expose a portion of the die pad 208. The first passivation layer 210 may include but is not limited to silicon nitride, silicon oxide, silicon oxynitride or any combination thereof.

Afterwards, a second passivation layer 212 is formed covering the die pad 208 and the first passivation layer 210, as shown in FIG. 1 in accordance with some embodiments of the disclosure. In some embodiments, the second passivation layer 212 is conformally formed on the first passivation layer 210 by a deposition process, such as a spin-on coating process, and a subsequent patterning process. The second passivation layer 212 may have an opening (not shown) to expose a portion of the die pad 208. The second passivation layer 212 may include but is not limited to polyimide, polybenzoxazole (PBO) or a combination thereof.

Afterwards, the conductive pillar bump structure 230 is formed on the die pad 208 of the semiconductor die 250, as shown in FIG. 1 in accordance with some embodiments of the disclosure. In some embodiments, the conductive pillar bump structure 230 includes an under bump metallurgy (UBM) stack 220, a conductive plug 224 on the UBM stack 220, a solder cap 228 on the conductive plug 224, and a conductive buffer layer 226 between the conductive plug 224 and the solder cap 228. In addition, the second passivation layer 212 may be disposed between the first passivation layer 210 and the conductive pillar bump structure 230.

As shown in FIG. 1, an under bump metallurgy (UBM) stack 220 of the conductive pillar bump structure 230 is formed passing through the first passivation layer 210 and the second passivation layer 212 and overlying the die pad 208. The UBM stack 220 may be formed filling the openings of the first passivation layer 210 and the second passivation layer 212. The UBM stack 220 may also extend onto a top surface 213 of the second passivation layer 212. In some embodiments, the UBM stack 220 includes a first metal layer 216 and a second metal pad 218 on the first metal layer 216. For example, the first metal layer 216 may be conformally formed on the first passivation layer 210, the second passivation layer 212 and the die pad 208 in the opening. The first metal layer 216 may be in contact with the die pad 208 of the semiconductor die 250. In addition, the second metal pad 218 may be formed overlying the first metal layer 216.

In some embodiments, the UBM stack 220 is formed by a photolithography process and subsequent electroplating processes. For example, the photolithography process may be performed to form a photoresist pattern (not shown) on the second passivation layer 212. The photoresist layer pattern may surrounds the openings of the first passivation layer 210 and the second passivation layer 212. The photoresist layer pattern may help to define a diameter and shape of the UBM stack 220. Next, the electroplating processes may be performed to sequentially form the first metal layer 216 and the second metal pad 218. Therefore, the UBM stack 220 may have a diameter D1 along a direction that is substantially parallel to a front-side surface 203 of the semiconductor die 250. In addition, a sidewall 215 of the first metal layer 216 is aligned with a sidewall 219 of the second metal pad 218. After the UBM stack 220 is formed, the photoresist pattern may be removed from the second passivation layer 212.

In some embodiments, the first metal layer 216 of the UBM stack 220 is formed of titanium (Ti), and the second metal pad 218 of the UBM stack 220 is formed of copper (Cu). In some embodiments, the thickness T1 of the second metal pad 218 is much thicker than the first metal layer 216 of the UBM stack 220. For example, the thickness T1 of the second metal pad 218 may be in a range from about 0.1 µm to about 10 µm. Therefore, a top surface 217 of the second metal pad 218 may be a planar surface (even surface). When the resulting semiconductor package 500 is bonded to a substrate, the second metal pad 218 of the UBM stack 220 may have improved mechanical strength (thick thickness) to reduce the stress on the extra-low-k (extra-low-dielectric constant) dielectric of the semiconductor die 250.

Afterwards, the conductive plug 224 of the conductive pillar bump structure 230 is formed on the UBM stack 220, as shown in FIG. 1 in accordance with some embodiments of the disclosure. In some embodiments, the conductive plug 224 is formed by another photolithography process and another subsequent electroplating process. For example, the photolithography process may be performed to form a photoresist pattern (not shown) covering a portion of the UBM stack 220. The photoresist layer pattern may help to define a diameter and shape of the conductive plug 224. Next, the electroplating processes may be performed to form the conductive plug 224 on a portion of the UBM stack 220 without covered by the photoresist layer pattern. Therefore, the conductive plug 224 may have a diameter D2 along a direction that is substantially parallel to a front-side surface 203 of the semiconductor die 250. In some embodiments, the conductive plug 224 and the second metal pad 218 of the UBM stack 220 are formed of the same material, such as copper (Cu). In some embodiments, the diameter D1 of UBM stack 220 (or the second metal pad 218 of the UBM stack 220) is greater than the diameter D2 of the conductive plug 224. In some embodiments, the thickness T2 of the conductive plug 224 is thicker than the thickness T1 of the second metal pad 218 of the UBM stack 220. In addition, the sum of the thickness T1 of the second metal pad 218 and the thickness T2 of the conductive plug 224 may be kept a fixed value according the design rule. For example, the thickness T2 of the conductive plug 224 may be in a range from about 1 µm to about 20 µm (or the ratio of the thickness T2 of the conductive plug 224 to the thickness T1 of the second metal pad 218 may be in a range from about 1 to about 1.5). When the resulting semiconductor package 500 is bonded to a substrate, the second metal pad 218 of the UBM stack 220 may have improved mechanical strength (the diameter D1 is larger than the diameter D2 of conductive plug 224) to reduce the stress on the extra-low-k (extra-low-dielectric constant) dielectric of the semiconductor die 250.

Afterwards, a conductive buffer layer 226 formed of nickel (Ni) is formed on the conductive plug 224 by another electroplating process, as shown in FIG. 1 in accordance with some embodiments of the disclosure. In some embodiments, the conductive buffer layer 226 serve as seed layers, adhesion layers, and barrier layers for the subsequent solder cap 228 formed thereon. After the conductive plug 224 and the conductive buffer layer 226 of the conductive pillar bump structure 230 are formed, the photoresist pattern may be removed from the second passivation layer 212.

Afterwards, the solder cap 228 is formed on the conductive buffer layer 226 by a photolithography process, a solder plating process, a photoresist stripping process, and a solder reflow process. After the solder cap 228 is formed, the semiconductor package 500 is formed.

FIGS. 2A-2B are plan views of areas 300A and 300B in FIG. 1. FIGS. 2A-2B are plan views showing arrangements of a second metal pad 218A of a UBM stack 220A and a conductive plug 224A of the conductive pillar bump structure 230, and the die pad 208 of the semiconductor die 250 of the semiconductor package 500 in accordance with some embodiments of the disclosure. In FIGS. 2A-2B, the first passivation layer 210 and the second passivation layer 212 are omitted. Because the sidewall 215 of the first metal layer 216 is aligned with the sidewall 219 of the second metal pad 218 in the cross-sectional view as shown in FIG. 1, a boundary 221A of the second metal pad 218 may serve as a boundary for the UBM stack 220A in the plan view shown in FIGS. 2A-2B. In addition, a boundary of the conductive plug 224A may serve as a boundary for the conductive pillar bump structure 230.

In some embodiments, the conductive plug 224A is overlying a portion of the top surface 217A of the second metal pad 218A of the UBM stack 220A. The boundary 221A of the UBM stack 220A may surround the boundary 225A of the conductive plug 224A from the plan view shown in FIG. 2A or FIG. 2B. The boundary 221A of the UBM stack 220A may be surrounded by the boundary of the die pad 208 of the semiconductor die 250 from the plan view shown in FIG. 2A or FIG. 2B. In addition, an overlapping area 214A between the conductive plug 224A and the top surface 217A of the UBM stack 220A is less than the area of the top surface 217A of the UBM stack 220A. As shown in FIGS. 2A-2B, the die pad 208 of the semiconductor die 250 may have a central point C1, the UBM stack 220A (or the second metal pad 218A) may have a central point C2 and the conductive plug 224A (or conductive pillar bump structure 230) may have a central point C3. In some embodiments, the central point C1 of the die pad 208 overlaps the central point C2 of the UBM stack 220A (or the second metal pad 218A). In other words, the die pad 208 and the UBM stack 220A are concentric from the plan view shown in FIG. 2A or FIG. 2B.

In some embodiments, the UBM stack 220A (or 220B) (or the second metal pad 218A (or 218B)) has 2-fold rotational symmetry, which is a 180-degree rotation around the central point C2 of the UBM stack (or the second metal pad), from the plan view shown in FIG. 2A or FIG. 2B. For example, the second metal pad 218A and the conductive plug 224A may be circular shapes in the plan view shown in FIGS. 2A-2B. In addition, the die pad 208 may be a square shape in the plan view shown in FIGS. 2A-2B.

In some embodiments, as shown in FIG. 2A, the central point C2 of the UBM stack 220A (or the second metal pad 218A) overlaps the central point C3 of the conductive plug 224A (or conductive pillar bump structure 230) from a plan view. In other words, the UBM stack 220A (or the second metal pad 218A) and the conductive plug 224A (or conductive pillar bump structure 230) are concentric from the plan view shown in FIG. 2A

In some embodiments, as shown in FIG. 2B, the central point C2 of the UBM stack 220A (or the second metal pad 218A) is positioned apart from the central point C3 of the conductive plug 224A (or the conductive pillar bump structure 230) by a distance S from a plan view. In addition, the central point C3 of the conductive plug 224A (or conductive pillar bump structure 230) is positioned apart from the central point C1 of the die pad 208 of the semiconductor die 500 by the distance S from a plan view as shown in FIG. 2B. As described previously, the central point C3 of the conductive plug 224A (or the conductive pillar bump structure 230) may be designed to be overlapping or away from the central point C2 of the UBM stack 220A (or the second metal pad 218A) to broaden design choices.

FIGS. 3A-3E are plan views showing shapes of second metal pads (e.g., second metal pads 218B, 218C, 218D, 218E and 218F) of UBM stacks (e.g., UBM stacks 220B, 220C, 220D, 220E and 220F) and the conductive plug 224A of the conductive pillar bump structure 230A in accordance with some embodiments of the disclosure. In some embodiments, the UBM stack (or the second metal pad) may have various shapes in the plan view for design choices. In some embodiments, the UBM stack stacks 220B, 220C, 220D, 220E and 220F (or the second metal pads 218B, 218C, 218D, 218E and 218F) has 2-fold rotational symmetry, which is a 180-degree rotation around the central point C2 of the UBM stack stacks 220B, 220C, 220D, 220E and 220F (or the second metal pads 218B, 218C, 218D, 218E and 218F), from plan views shown in FIGS. 3A-3E. For example, the UBM stack 220B (or the second metal pad 218B) is may be an oval-shape from the plan view shown in FIG. 3A. In addition, the UBM stack (or the second metal pad) may have polygonal shapes from plan views shown in FIG. 3B-3D. For example, the UBM stack 220C (or the second metal pad 218C) may be a square shape from the plan view shown in FIG. 3B. The UBM stack 220D (or the second metal pad 218D) may be a hexagonal shape from the plan view shown in FIG. 3C. The UBM stack 220E (or the second metal pad 218E) is may be an octagonal shape from the plan view shown in FIG. 3D. Furthermore, the UBM stack 220F (or the second metal pad 218F) is may be a rounded shape from the plan view shown in FIG. 3E. In some embodiments, the die pad 208 is a square shape and the conductive plug 224A is a circular shape in the plan view shown in FIGS. 3A-3E.

FIGS. 4A-4E are plan views showing shapes of second metal pads (e.g., second metal pads 218B, 218C, 218D, 218E and 218F) of UBM stacks (e.g., UBM stacks 220B, 220C, 220D, 220E and 220F) and conductive plugs (e.g., conductive plugs 224B, 224C, 224D, 224E and 224F) of conductive pillar bump structures (e.g., conductive pillar bump structures 230B, 230C, 230D, 230E and 230F) in accordance with some embodiments of the disclosure. The conductive plug (or the conductive pillar bump structure) may have various shapes in the plan view for design choices. In some embodiments, the conductive plugs 224B, 224C, 224D, 224E and 224F (or the conductive pillar bump structures 230B, 230C, 230D, 230E and 230F) may be designed to have shapes that are similar to the corresponding second metal pads 218B, 218C, 218D, 218E and 218F of the UBM stacks 220B, 220C, 220D, 220E and 220F in the plan views shown FIGS. 4A-4E. In some embodiments, the conductive plugs 224B, 224C, 224D, 224E and 224F (or the conductive pillar bump structures 230B, 230C, 230D, 230E and 230F) of the conductive pillar structure may be designed to have 2-fold rotational symmetry, which is a 180-degree rotation around the central point C3 of the conductive plugs 224B, 224C, 224D, 224E and 224F (or the conductive pillar bump structures 230B, 230C, 230D, 230E and 230F), in the plan views shown FIGS. 4A-4E. For example, the conductive plug 224B (or the conductive pillar bump structure 230B) is may be an oval-shape from the plan view shown in FIG. 4A. In addition, the conductive plug (or the conductive pillar bump structure) may have polygonal shapes from the plan views shown in FIG. 4B-4D. For example, the conductive plug 224C (or the conductive pillar bump structure 230C) may be a square shape from the plan view shown in FIG. 4B. The conductive plug 224D (or the conductive pillar bump structure 230D) may be a hexagonal shape from the plan view shown in FIG. 4C. The conductive plug 224E (or the conductive pillar bump structure 230E) is may be an octagonal shape from the plan view shown in FIG. 4D. Furthermore, the conductive plug 224F (or the conductive pillar bump structure 230F) is may be a rounded shape from the plan view shown in FIG. 4E. In some embodiments, the die pad 208 is a square shape in the plan view shown in FIGS. 4A-4E.

Embodiments provide a semiconductor package, for example, a flip-chip package. The semiconductor package includes a semiconductor die and a conductive pillar bump structure and a conductive plug. The semiconductor die has a die pad thereon. The conductive pillar bump structure is positioned overlying the die pad. In some embodiments, the conductive pillar bump structure includes an under bump metallurgy (UBM) stack having a first diameter and a conductive plug having a first diameter a second diameter that is different than the first diameter. In some embodiments, an overlapping area between the conductive plug and a top surface of the UBM stack is less than an area of the top surface of the UBM stack. In some embodiments, a boundary of the UBM stack surrounds a boundary of the conductive plug from a plan view. The UBM stack may include a first metal layer in contact with the die pad and a second metal pad on the first metal layer. As described previously, the second metal pad of the UBM stack and the conductive plug may be formed of copper (Cu). In some embodiments, the thickness of the second metal pad is thick enough so that a top surface of the second metal pad is a planar surface (even surface). When the resulting semiconductor package is bonded to a substrate, the second metal pad of the UBM stack may have improved mechanical strength (thick thickness and a larger diameter than the diameter of the conductive plug) to reduce the stress on the extra-low-k (ELK) dielectric layers of the semiconductor die. Therefore, the problem of cracks forming in the ELK dielectric layers can be avoided.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
a semiconductor die having a die pad on a base and a passivation layer on the die pad, wherein the passivation layer exposes a portion of the die pad; and
a conductive pillar bump structure overlying the die pad, wherein the conductive pillar bump structure comprises:
an under bump metallurgy (UBM) stack having a first diameter, wherein the UBM stack comprises:
a first metal layer in contact with the die pad of the semiconductor die; and
a second metal pad overlying the first metal layer and in contact with a conductive plug, and the first metal layer is disposed between the passivation layer and the second metal pad, wherein the second metal pad has a planar upper surface across an entirety of the second metal pad; and
the conductive plug on the UBM stack,
wherein the conductive plug has a second diameter that is different than the first diameter,
wherein a first region of a sidewall of the conductive plug overlaps an opening in the passivation layer and a second region of a sidewall of the conductive plug overlaps the passivation layer,
wherein a ratio of a thickness of the conductive plug to a thickness of the second metal pad is from 1 to 1.5.

2. The semiconductor package as claimed in claim 1, wherein the first diameter and the second diameter are along a direction that is substantially parallel to a front-side surface of the semiconductor die.

3. The semiconductor package as claimed in claim 1, wherein the first diameter is greater than the second diameter.

4. The semiconductor package as claimed in claim 1, wherein an overlapping area between the conductive plug and a top surface of the UBM stack is less than an area of the top surface of the UBM stack.

5. The semiconductor package as claimed in claim 1, wherein the conductive plug is overlying a portion of a top surface of the UBM stack.

6. The semiconductor package as claimed in claim 1, wherein an interface between the conductive plug and the UBM stack is a planar surface.

7. The semiconductor package as claimed in claim 1, wherein the second metal pad and the conductive plug are formed of a same metal material.

8. The semiconductor package as claimed in claim 1, wherein a central point of the second metal pad is positioned apart from a central point of the conductive plug from a plan view, wherein the conductive plug is disposed on the second metal pad in an asymmetric placement from the plan view.

9. The semiconductor package as claimed in claim 1, wherein the second metal pad and the die pad of the semiconductor die are concentric from a plan view.

10. The semiconductor package as claimed in claim 1, wherein a central point of the conductive plug is positioned apart from a central point of the die pad of the semiconductor die from a plan view.

11. The semiconductor package as claimed in claim 1, wherein the second metal pad has 2-fold rotational symmetry, which is a 180-degree rotation around a central point of the second metal pad, from a plan view.

12. The semiconductor package as claimed in claim 1, wherein the second metal pad is a circular shape, an oval-shape, a polygonal shape or a rounded shape from a plan view.

13. The semiconductor package as claimed in claim 1, wherein a first sidewall of the first metal layer is aligned with a second sidewall of the second metal pad.

14. The semiconductor package as claimed in claim 1, wherein a boundary of the UBM stack surrounds a boundary of the conductive plug from a plan view.

15. The semiconductor package as claimed in claim 1, wherein the conductive pillar bump structure comprises:
a solder cap on the conductive plug; and
a conductive buffer layer between the conductive plug and the solder cap.

16. The semiconductor package as claimed in claim 1, wherein the passivation layer of the semiconductor die comprises:
a first passivation layer covering another portion of the die pad; and
a second passivation layer disposed between the first passivation layer and the conductive pillar bump structure, on the die pad.

17. A semiconductor package, comprising:
a semiconductor die having a die pad on a base and a passivation layer on the die pad, wherein the passivation layer exposes a portion of the die pad; and
a conductive pillar bump structure overlying the die pad, wherein the conductive pillar bump structure comprises:
an under bump metallurgy (UBM) stack in contact with the die pad, wherein the UBM stack comprises:
a first metal layer in contact with the die pad of the semiconductor die; and
a second metal pad overlying the first metal layer and in contact with a conductive plug, wherein the second metal pad has a planar upper surface across an entirety of the second metal pad, and the first metal layer is disposed between the passivation layer and the second metal pad; and
the conductive plug in contact with the UBM stack,
wherein an overlapping area between the conductive plug and a top surface of the UBM stack is less than an area of the top surface of the UBM stack,
wherein a first region of a sidewall of the conductive plug overlaps an opening in the passivation layer and a second region of a sidewall of the conductive plug overlaps the passivation layer,
wherein a ratio of a thickness of the conductive plug to a thickness of the second metal pad is from 1 to 1.5.

18. A semiconductor package, comprising:
a semiconductor die having a die pad on a base and a passivation layer on the die pad, wherein the passivation layer exposes a portion of the die pad; and
a conductive pillar bump structure overlying the die pad, wherein the conductive pillar bump structure comprises:
a conductive plug; and
an under bump metallurgy (UBM) stack between the die pad and the conductive plug, wherein the UBM stack comprises:
a first metal layer in contact with the die pad of the semiconductor die; and
a second metal pad overlying the first metal layer and in contact with the conductive plug, wherein the second metal pad has a planar upper surface across an entirety of the second metal pad, and the first metal layer is disposed between the passivation layer and the second metal pad,
wherein a boundary of the UBM stack surrounds a boundary of the conductive plug from a plan view,
wherein a first region of a sidewall of the conductive plug overlaps an opening in the passivation layer and a second region of a sidewall of the conductive plug overlaps the passivation layer,
wherein a ratio of a thickness of the conductive plug to a thickness of the second metal pad is from 1 to 1.5.

19. The semiconductor package as claimed in claim 18, wherein the conductive plug and the second metal pad have different shapes from the plan view.

* * * * *